US 6,677,739 B1

(12) United States Patent
Bartol et al.

(10) Patent No.: US 6,677,739 B1
(45) Date of Patent: Jan. 13, 2004

(54) HIGH-RELIABILITY, LOW-COST, PULSE-WIDTH-MODULATED VEHICULAR ALTERNATOR VOLTAGE REGULATOR WITH SHORT-CIRCUIT PROTECTION AND LOW INSERTED ELECTRICAL NOISE

(76) Inventors: Muriel Bartol, 2404 Wilshire Blvd., Los Angeles, CA (US) 90057; Luis E. Bartol, c/o Industrias Condor, S.A. de C.V. Blvd M. Cervantes Saevedra no. 17 Col Granada, 11520 Mexico (MX)

( * ) Notice: Subject to any disclaimer, the term of this patent is extended or adjusted under 35 U.S.C. 154(b) by 0 days.

(21) Appl. No.: 10/300,052

(22) Filed: Nov. 19, 2002

(51) Int. Cl.[7] .................................................. H02H 7/06
(52) U.S. Cl. ............................. 323/284; 322/25; 322/28
(58) Field of Search ........................... 323/284; 322/25, 322/26, 27, 28

(56) References Cited

U.S. PATENT DOCUMENTS

| 4,428,016 A | * | 1/1984 | Brasfield | ..................... 361/18 |
| 6,366,070 B1 | * | 4/2002 | Cooke et al. | ................ 323/284 |
| 6,534,963 B2 | * | 3/2003 | Bayer et al. | ................. 323/313 |
| 6,593,725 B1 | * | 7/2003 | Gallagher et al. | .......... 323/284 |

* cited by examiner

Primary Examiner—Bao Q. Vu
(74) Attorney, Agent, or Firm—Fuess & Davidenas

(57) ABSTRACT

An output stage of a conventional Frequency-on-Demand electronic voltage regulator, such as a voltage regulator of the type described in U.S. Pat. No. 5,642,033, is reconfigured as a bi-stable multivibrator, or flip-flop. An oscillator provides a reset pulse of pre-defined pulse width and pulse period to initiate an "on" period of the output stage; a conventional error amplifier synchronously switches the output stage "off" when a system voltage reaches a preset value. Voltage regulation by a constant-frequency, pulse-width-modulated, output signal is thus realized at reduced cost and complexity. Total capacitance between the gate-source terminals of a preferred MOS power output transistor serves to slow both negative- and positive-going output control signal transitions, introducing a minimum of electrical noise into the vehicle's electrical system.

10 Claims, 5 Drawing Sheets

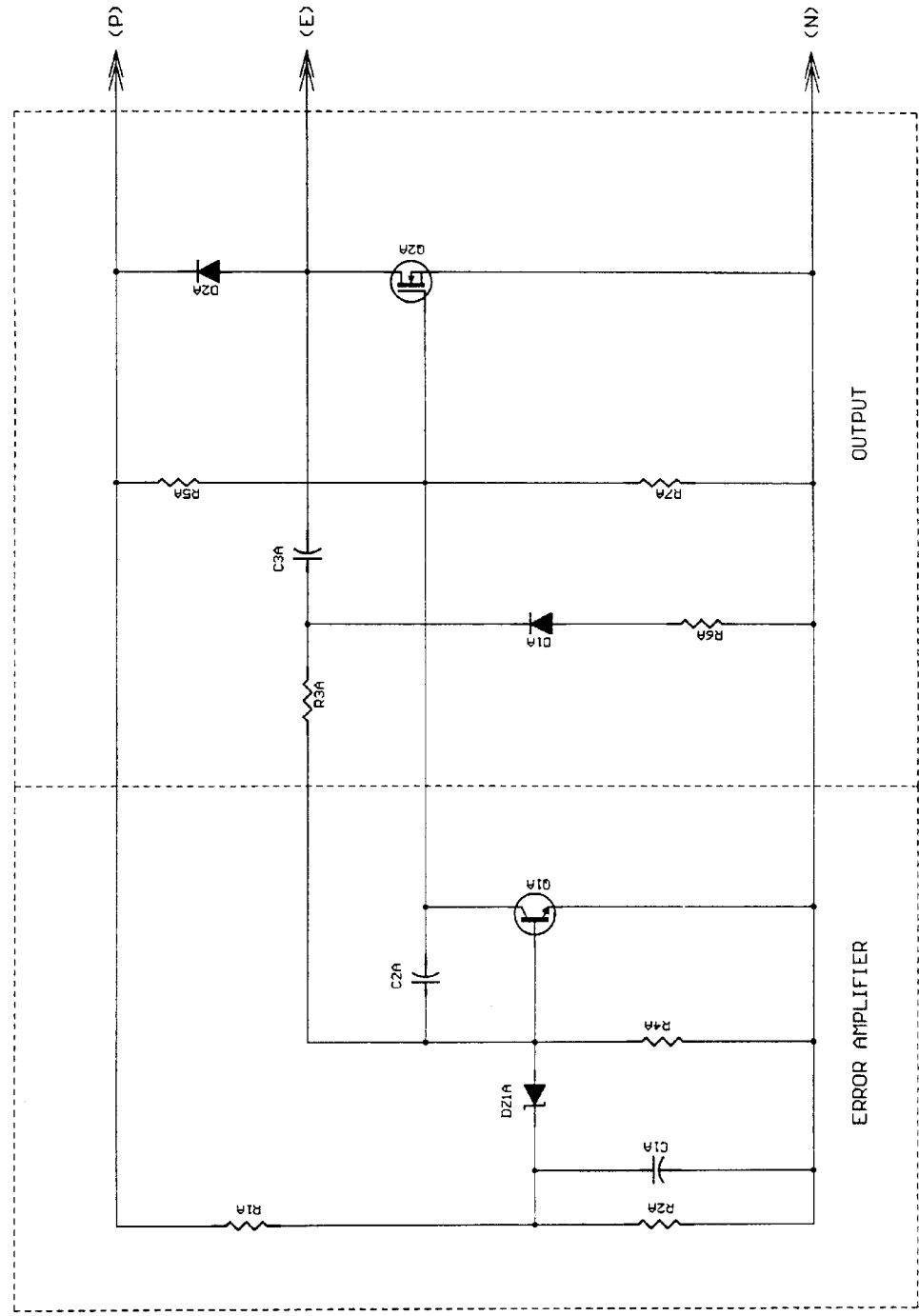
Fig. 1 PRIOR ART-FIRST EMBODIMENT

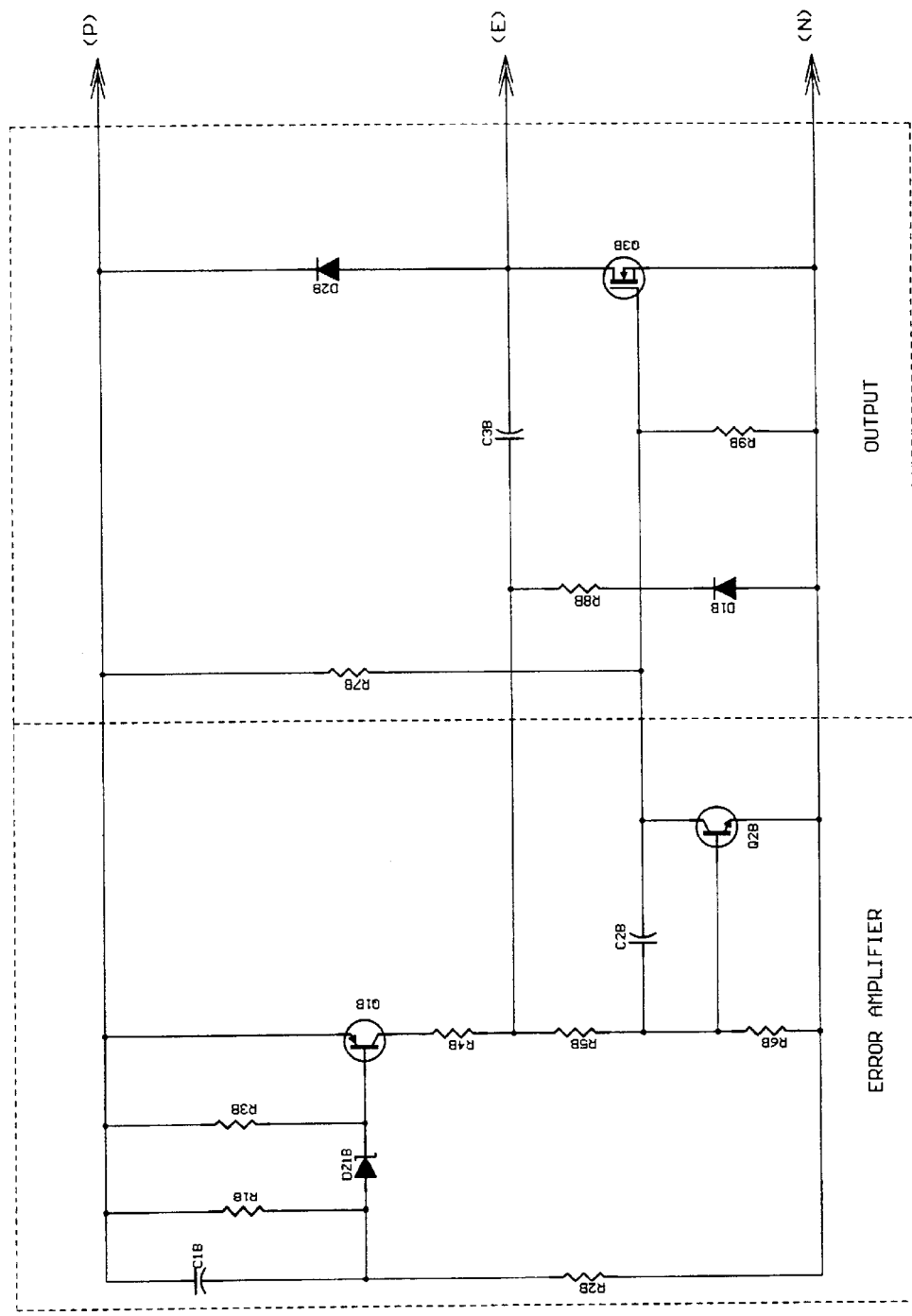
Fig. 2 PRIOR ART-SECOND EMBODIMENT

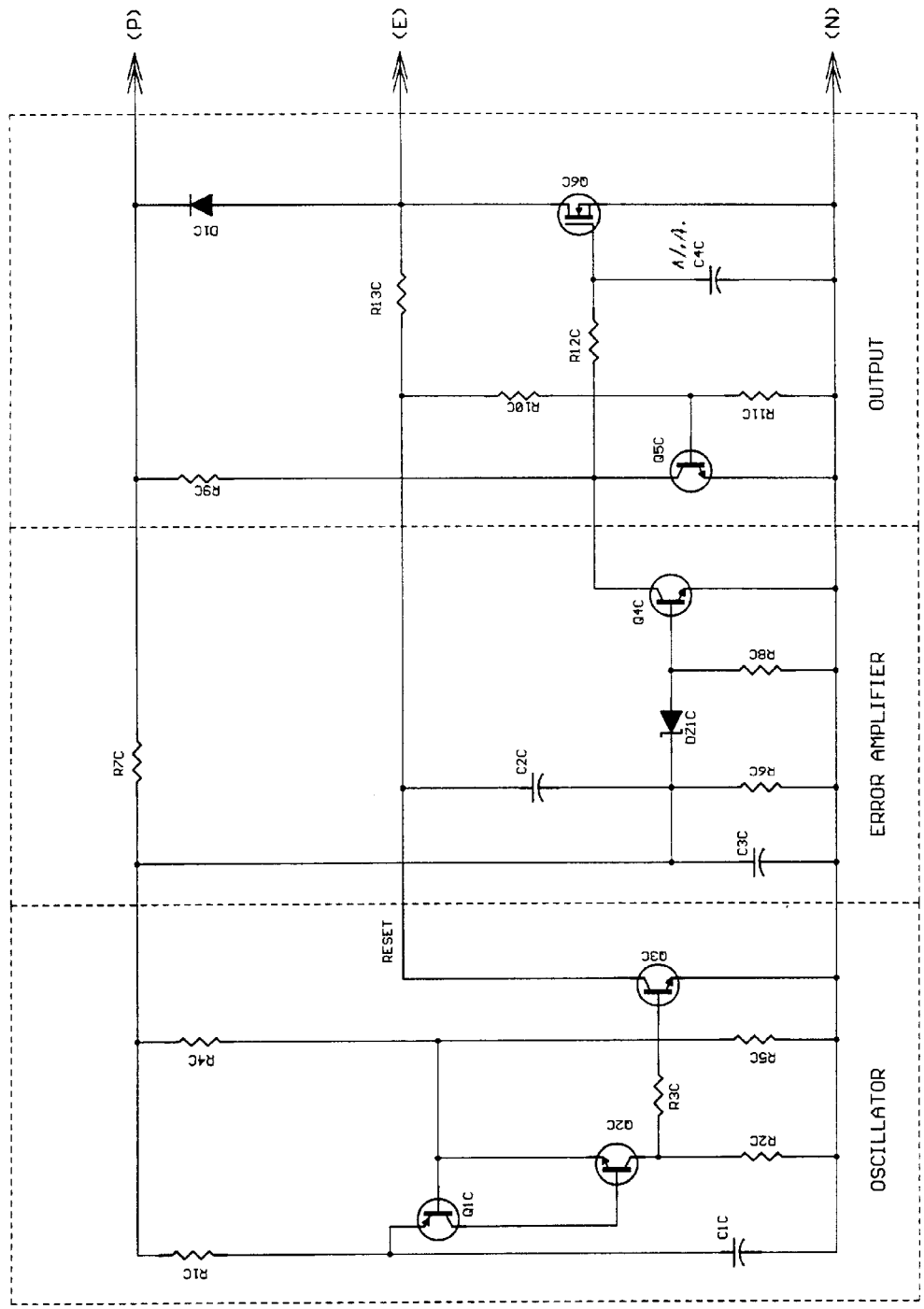
Fig. 3 FIRST PREFERRED EMBODIMENT

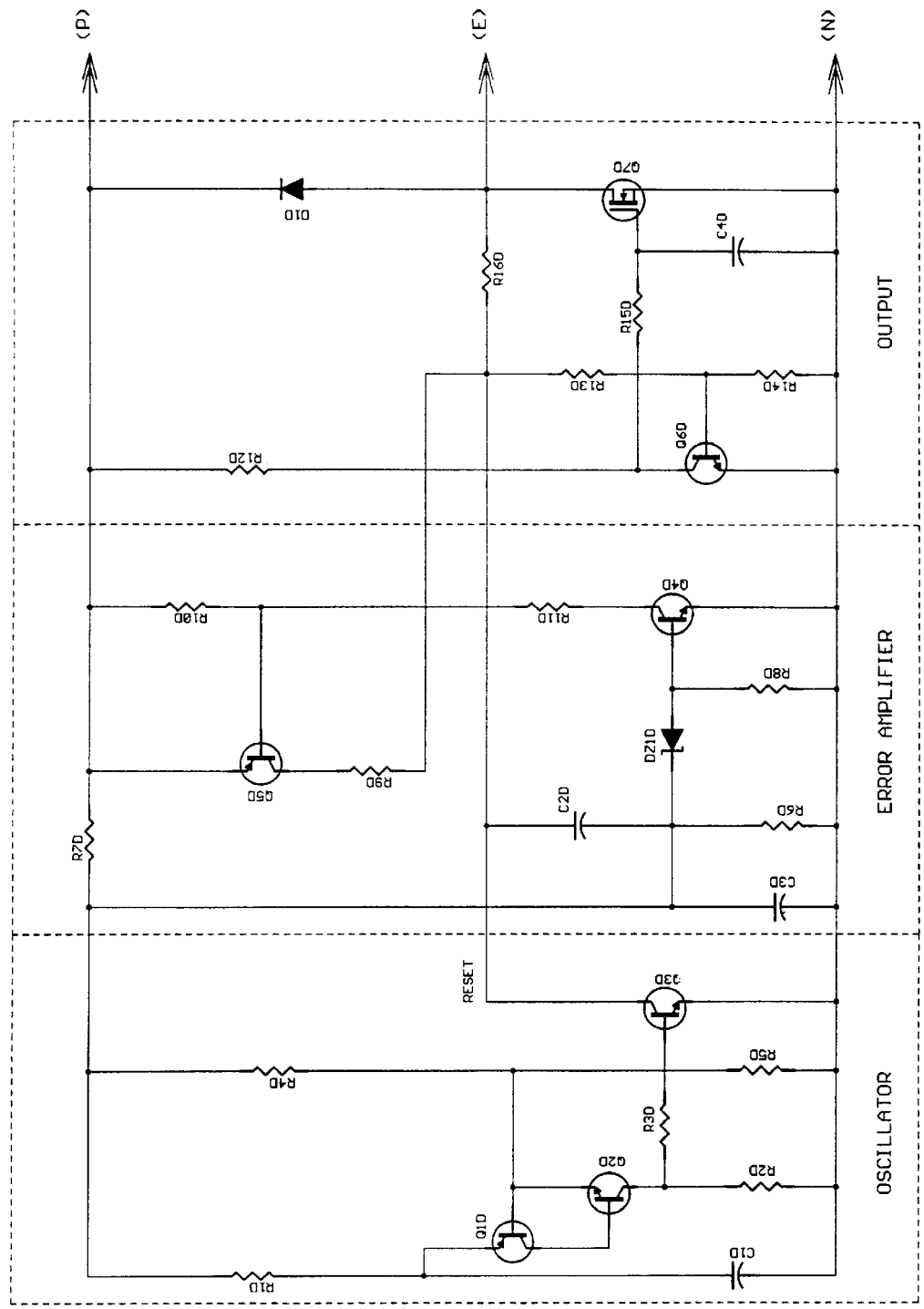
Fig. 4 SECOND PREFERRED EMBODIMENT

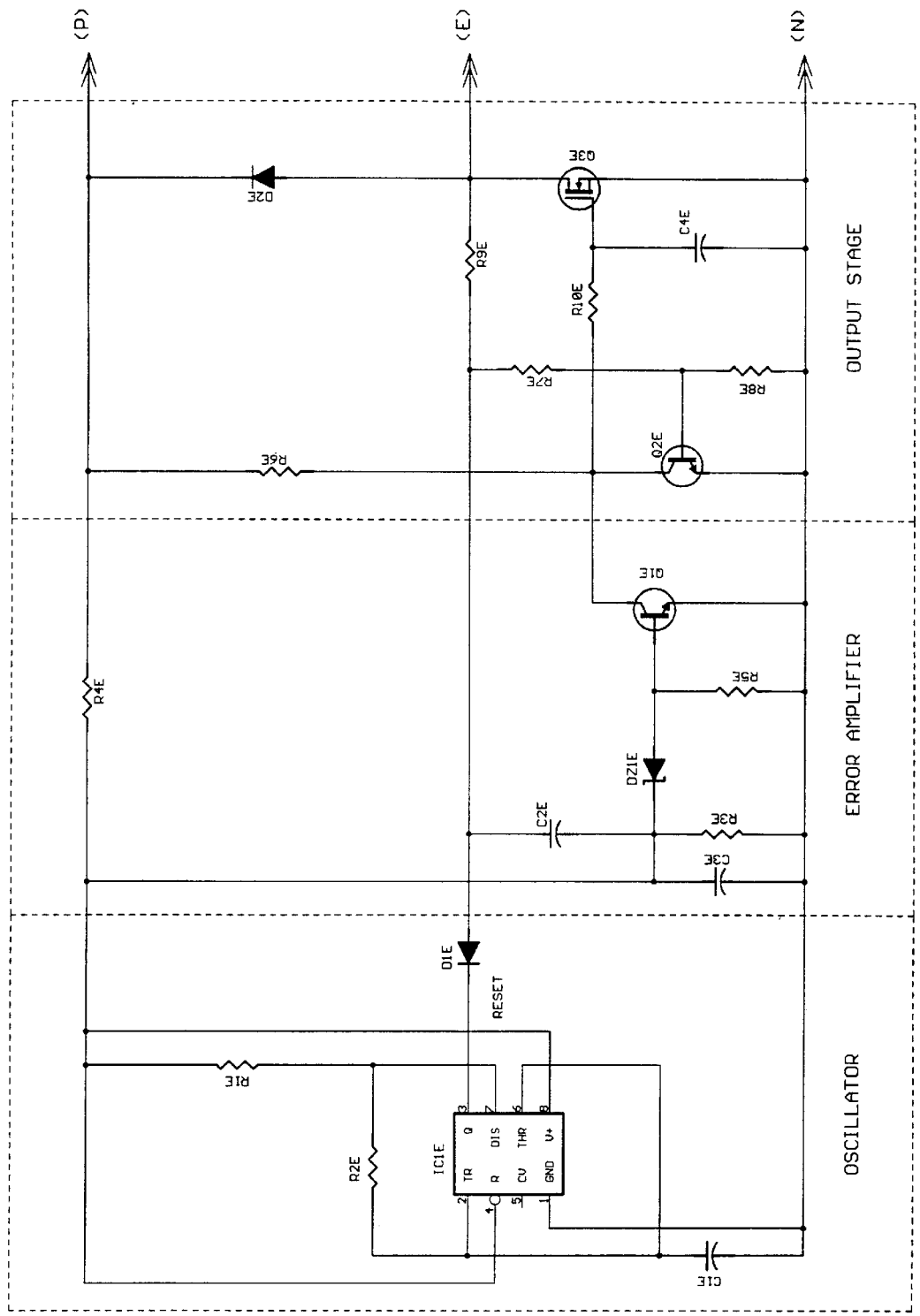
Fig. 5 THIRD PREFERRED EMBODIMENT

HIGH-RELIABILITY, LOW-COST, PULSE-WIDTH-MODULATED VEHICULAR ALTERNATOR VOLTAGE REGULATOR WITH SHORT-CIRCUIT PROTECTION AND LOW INSERTED ELECTRICAL NOISE

RELATION TO RELATED PATENTS

The present invention is related to the invention of U.S. Pat. No. 5,642,033 issued Jun. 24, 1997, for an OVERLOAD-PROTECTED AND REFERENCE-VOLTAGE-LOSS-PROTECTED ELECTRONIC VOLTAGE REGULATOR FOR VEHICULAR-TYPE ALTERNATORS THAT BOTH TOLERATES MOMENTARY HIGH FIELD CURRENTS AND SUPPRESSES LOW FREQUENCY NOISE to the selfsame Luis E. Bartol who is one of the two co-inventors of the present invention. The contents of the related predecessor patent are incorporated herein by reference.

BACKGROUND OF THE INVENTION

1. Field of the Invention

The present invention generally concerns improvements to voltage regulators, specifically including voltage regulators that are used to regulate alternators on vehicles.

The present invention particularly concerns improvements to vehicular electronic voltage regulators used in heavy duty, high current, high performance applications.

Because the main design intent of the present invention is concerned with the high-reliability voltage regulation of vehicular alternators deployed in heavy duty applications, the improvements of the present invention will be seen to be particularly useful for (i) revenue-generating vehicles such as trucks and buses, and (ii) emergency vehicles such as ambulances and fire trucks, supporting large electrical loads.

2. Description of Prior Art

Two basic design technologies have dominated the electronic voltage regulator art: (i) Frequency-On-Demand and (ii) Pulse-Width-Modulation.

2.1 Frequency-On-Demand

Frequency-On-Demand regulation of alternator voltage is by far the oldest, simplest, cheapest and most widely used design. Frequency-On-Demand voltage regulation provides adequate performance in most automotive and light duty applications.

Frequency-On-Demand voltage regulation works on the principle that an error signal is generated by comparing the vehicle's electrical system voltage to an internal reference in an error amplifier stage to produce an error signal. This error signal is then further amplified and used to drive an output stage of the voltage regulator. The regulator's output stage in turn controls the current through the alternator's field winding. An interaction between the output stage and the error amplifier stage (normally through an RC network), produces a sharply defined rectangular pulse-train whose duty cycle determines the excitation level in the alternator's field winding and hence, the current generating capacity of the alternator.

Due to increasing use of electrical power in vehicles, alternators have become larger, resulting in increased response time due to the very large field inductances and currents involved. When the response time of a large alternator is added to the response time of a commensurately robust voltage regulator itself, then a noticeable and objectionable voltage/current low-frequency fluctuation is observed to occur at the alternator's output. This phenomena is most noticeable both at no-load and near full-load conditions of the alternator.

In an attempt to deal with this problem, the modern Frequency-on-Demand voltage regulator is designed with a fast response time. The problem with this avenue of improvement has been that when the ON-OFF-ON transitions of the control pulse-train of the alternator are made to occur faster then the level of electrical noise introduced into the vehicle's electrical system is increased.

With the present (circa 2002) massive use of computers in vehicles, the demand for electrically clean, stable voltage in the vehicle's electrical system has become a driving factor forcing improvements over the traditional Frequency-on-Demand approach to voltage regulation.

2.2 Pulse-Width-Modulation

In Pulse-Width-Modulation regulation of alternator voltage, a constant frequency pulse-train is internally generated by the voltage regulator and the duty cycle (or pulse width) is then modulated to vary the excitation level in the alternator's field winding. Since the field-driving pulse-train has a constant frequency that does not depend on external variables such as the field inductance and current flowing into the field, this technology eliminates the low-frequency fluctuations of the Frequency-on-Demand systems. Also, rise and fall times of the ON-OFF-ON transitions can be made sufficiently slow to insert a minimum of electrical noise into the vehicle's electrical system.

Alas, these improvements result in both higher cost and higher complexity. Thus, although Pulse-Width-Modulation is a flexible and powerful approach to voltage regulation, up until present, circa 2002, cost and complexity issues have kept this technology available only in those applications that have demanded the highest levels of performance.

SUMMARY OF THE INVENTION

The present invention—which has been fully and thoroughly tested by its inventors—contemplates modifications to proven and highly-reliable Frequency-on-Demand voltage regulators towards the goal of modifying their performance so as to alter their operating mode from Frequency-on-Demand to constant-frequency Pulse-Width-Modulation.

The modifications required to accomplish this objective are as follows:

An "OUTPUT" stage of the voltage regulator is reconfigured as a bi-stable multivibrator (also known in electronics engineering as a "flip-flop"). This flip-flop circuit also provides an efficient and economical short-circuit protection function for the output power transistor.

An "OSCILLATOR", implemented with any of a number of technologies both discrete and integrated, provides a "RESET" pulse to the flip-flop with a pre-defined pulse width and pulse period. This "RESET" pulse initiates the "ON" period of the "OUTPUT" stage.

An "ERROR AMPLIFIER" stage of conventional construction rapidly switches the "OUTPUT" stage "OFF" when system voltage synchronously reaches a preset value, thus terminating the "ON" period.

Incidental to this construction, the total capacitance across the gate-source terminals of the output stage transistor—normally an MOS power transistor—is selected and is intentionally used to slow down the negative- and positive-going transitions of the transistor to introduce a minimum of electrical noise into the vehicle's electrical system.

The collective modifications to a Frequency-on-Demand voltage regulator required to so improve its performance by making it into a Pulse-Width-Modulation voltage regulator do not significantly affect the existing (i) reliability or (ii) complexity of this voltage regulator. Indeed, Pulse-Width-Modulation voltage regulators in accordance with the present invention have a substantially similar (i) parts count, and (ii) reliability, to those current (circa 2002) state-of-the-art Frequency-on-Demand regulators which they serve to replace.

Furthermore, the cost of a Pulse-Width-Modulation voltage regulator in accordance with the present invention is only but slightly altered from the Frequency-on-Demand type that it supplants. This is the case even though the performance of a Pulse-Width-Modulation voltage regulator in accordance with the present invention realizes all the valuable features of a true Pulse-Width-Modulation electronic voltage regulator of considerably more complex design.

1. An Electronic Voltage Regulator

Accordingly, in one of its aspects the present invention can be considered to be embodied in an electronic voltage regulator for regulating an alternator to maintain constant a system voltage where a flip-flop, sensitive to a "RESET" pulse to initiate an "ON" condition, serves as an "OUTPUT" stage of the voltage regulator.

An oscillator produces a "RESET" pulse having a pre-defined pulse width and pulse period, and provides this "RESET" pulse to the "OUTPUT" stage flip-flop.

Meanwhile, an "ERROR AMPLIFIER" stage synchronously switches the "OUTPUT" stage flip-flop "OFF" when the system voltage reaches a preset value, thus terminating the "ON" period of the "OUTPUT" stage flip-flop.

By these components, and these connections, the oscillator, the error amplifier and the output stage flip-flop produce in combination a pulse-width-modulated signal.

The OUTPUT stage flip-flop may in particular include a Field Effect Transistor (FET) having gate and source terminals. The parasitic capacitance of the gate-source terminals of this FET—either acting alone or in combination with an external discrete capacitor—serves to slow both negative- and positive-going transitions of the OUTPUT stage flip-flop, therein introducing a minimum of electrical noise into an electrical system in which the electronic voltage regulator is used.

The oscillator may in particular be realized as a two-transistor equivalent to a Programmable Unijunction Transistor (PUT), being two transistors with one transistor connected backwards to the other with its emitter and its collector interchanged so as to lower gain and avoid PUT latching. This unusual construction conserves components, and is thus economical.

In yet another unusual use of components, two capacitors are used as a voltage divider in the error amplifier stage, with a signal from one capacitor being fed forward to the output amplifier. This signal accelerates the "ON" and "OFF" transitions in the OUTPUT stage. Furthermore, the capacitor providing this signal also implements a "voltage bleeder" function on an integrating capacitor of the error amplifier stage, assuring that a RESET pulse "bleeds away" a small fraction of the voltage stored on this integrating capacitor (by virtue of capacitive divider effect) and assuring proper synchronization between the "ERROR AMPLIFIER" stage and the "OUTPUT" stage, permitting the integrating capacitor to be reset at the start of each "ON" cycle to a smaller voltage by virtue of the RESET pulse. Noise immunity, as well as response time, is thus improved.

2. An Improvement to an Electronic Voltage Regulator So as to Cause It to Produce a Pulse-width-modulated Signal In another of its aspects the present invention can be considered to be embodied in an improvement to an electronic voltage regulator so as to cause the voltage regulator to produce a pulse-width-modulated signal.

The improvement is to an electronic voltage regulator producing a frequency-on-demand signal across the field winding of an alternator, the voltage regulator being connected across a battery that develops a voltage between a positive terminal and a negative terminal. This conventional voltage regulator has, among other parts, (1) an error amplifier, having a signal input port and a signal output port, selectively conducting respective to variations in the voltage of the battery so as to produce a control signal, which error amplifier is connected at its signal output port to (2) an output transistor responsive to the control signal for selectively conducting so as to produce at its output port the frequency-on-demand signal.

To this electronic voltage regulator the improvement of the present invention adds an oscillator producing and providing a "RESET" pulse having a pre-defined pulse width and pulse period. Meanwhile, the output transistor is used as one leg of a flip-flop. This flip-flop is sensitive to (i) the "RESET" pulse from the oscillator to initiate an "ON" condition of the flip-flop (where its output transistor conducts), and to (ii) the error amplifier stage for—when the system voltage synchronously reaches a preset value—switching the flip-flop to an "OFF" condition (where its output transistor does not conduct). The "ON" and the "OFF" periods of the flip-flop accordingly alternate.

By this construction, this connection, and this coaction (i) the oscillator, (ii) the error amplifier and (iii) the flip flop of which a one leg is the output transistor, produce in combination the pulse-width-modulated signal.

The oscillator is preferably a two-transistor equivalent to a Programmable Unijunction Transistor (PUT). Namely, it is two transistors with one transistor connected backwards to the other with its emitter and its collector interchanged so as to lower gain and avoid PUT latching.

3. A Method of Regulation of a System Voltage Produced by an Alternator

In yet another of its aspects the present invention can be considered to be embodied in a method of the regulation of a system voltage produced by an alternator having a field coil.

The method consists of controlling field coil current to the alternator through a bi-stable multivibrator, also called a flip-flop.

Resetting the flip flop to provide the field coil current is realized by and with a reset pulse of pre-defined pulse width and pulse period. This reset pulse is produced by an oscillator.

Setting the flip flop to turn off field coil current to the alternator is realized with and by a signal synchronously produced in an error amplifier when voltage produced by the alternator reaches a preset value.

By this method a constant-frequency, pulse-width-modulated, output signal is realized.

These and other aspects and attributes of the present invention will become increasingly clear upon reference to the following drawings and accompanying specification.

BRIEF DESCRIPTION OF THE DRAWINGS

Referring particularly to the drawings for the purpose of illustration only and not to limit the scope of the invention in any way, these illustrations follow:

FIGS. 1 and 2 show the schematic diagrams of first and second embodiments of a prior art voltage regulator built according to the principles taught in U.S. Pat. No. 5,642,033.

FIG. 3 is a schematic diagram of a first preferred embodiment of the "core" electronic voltage regulator of the present invention.

FIG. 4 is a schematic diagram of another, second, preferred embodiment of the "core" electronic voltage regulator of the present invention.

FIG. 5 is a schematic diagram of yet another, third, preferred embodiment of the "core" electronic voltage regulator of the present invention.

DESCRIPTION OF THE PREFERRED EMBODIMENT

The following description is of the best mode presently contemplated for the carrying out of the invention. This description is made for the purpose of illustrating the general principles of the invention, and is not to be taken in a limiting sense. The scope of the invention is best determined by reference to the appended claims.

Although specific embodiments of the invention will now be described with reference to the drawings, it should be understood that such embodiments are by way of example only and are merely illustrative of but a small number of the many possible specific embodiments to which the principles of the invention may be applied. Various changes and modifications obvious to one skilled in the art to which the invention pertains are deemed to be within the spirit, scope and contemplation of the invention as further defined in the appended claims.

1. Advanced Prior Art Frequency-on-Demand Voltage Regulators

The present invention is generally applicable to electronic voltage regulators in general, and to frequency-on-demand type electronic voltage regulators in particular. For purposes of illustration, the present invention is taught by comparison to the particular prior art voltage regulator taught within U.S. Pat. No. 5,642,033 issued Jun. 24, 1997, for an OVERLOAD-PROTECTED AND REFERENCE-VOLTAGE-LOSS-PROTECTED ELECTRONIC VOLTAGE REGULATOR FOR VEHICULAR-TYPE ALTERNATORS THAT BOTH TOLERATES MOMENTARY HIGH FIELD CURRENTS AND SUPPRESSES LOW FREQUENCY NOISE. As the title of this patent indicates, the advanced voltage regulator which is the subject of the patent is (1) protected against damage due to overload, (2) protected against damage due to loss of reference voltage, (3) tolerant of momentary high field currents, and (4) suppressing of low frequency noise. Coupled with an economical construction using few components, this previous voltage regulator has enjoyed both exceptional immunity to failure and good success in the market.

Electrical schematics of two embodiments of this prior art voltage regulator are shown in FIGS. 1 and 2. Explanation of this prior art voltage regulator of FIGS. 1 and 2 can be found in the aforementioned U.S. Pat. No. 5,642,033. Persons who are conversant with the electrical operation of voltage regulators normally need not read this prior patent in order to understand the present invention, a detailed understanding of these particular prior art circuits not being required for appreciation of the present invention, which stands on its own merit.

2. A Preferred, First, Embodiment of a Pulse-Width-Modulated Electronic Voltage Regulator in Accordance With the Present Invention A schematic diagram of a preferred, first, embodiment of a pulse-width-modulated electronic voltage regulator in accordance with the present invention is shown in FIG. 3. A functional description of this preferred first, proposed embodiment is as follows:

The network comprised of transistors Q5C and Q6C plus resistors R9C, R10C, R11C, R12C and R13C plus capacitor C4C collectively functionally realizes a bi-stable multivibrator (also known as a flip-flop). The "ON" time (Q6C conducting) of this flip-flop must be initiated by a negative-going "RESET" pulse applied to the base-emitter junction of transistor Q5C (through a voltage divider comprised of resistors R10C, R11C). The RESET pulse turns Q5C "OFF" and, assuming that transistor Q4C is also "OFF", output MOS power transistor Q6C will be driven into conduction through gate-charging resistors R9C and R12C. The resistive sum of resistors R9C and R12C plus the inherent gate-source capacitance of MOS power transistor Q6C acting alone or in parallel with an additional capacitor (represented as C4C in FIG. 3) forms an RC circuit the time constant of which suffices to turn power transistor Q6C "ON" but slowly, thus avoiding an abrupt "OFF" to "ON" transition with its associated high electrical noise. With power transistor Q6C firmly "ON", by way of the flip-flop action of the "OUTPUT" stage, alternator field current will flow through transistor Q6C until interrupted by either of the two following events:

First, the error-amplifier transistor Q4C can go into conduction.

Considering steady state conditions with the vehicle's alternator rotating, the voltage-detection network comprised of R6C, R7C, C3C, DZ1C, develops a voltage across the base-emitter resistor R8C of error-amplifier transistor Q4C that is proportional to the difference between (i) the vehicle's system voltage (across terminals "P" and "N") and (ii) the reference voltage DZ1C.

As system voltage builds up because of current flowing into the alternator's field winding, error voltage across R8C will eventually come to exceed the base-emitter threshold of error-amplifier transistor Q4C. This transistor Q4C will then start conducting and—aided by the positive feedback effect of the speed-up network comprised of R13C and C2C—will rapidly drive transistor Q4C into saturation. As a result, transistor Q6C will come out of conduction with its total gate-source capacitance C4C and resistor R12C essentially determining the speed at which MOS power transistor Q6C comes out of conduction. If R12C is properly chosen, the electrical noise associated with the "ON" to "OFF" transition is greatly attenuated.

Before continuing with explanation of the preferred, first, embodiment of a pulse-width-modulated electronic voltage regulator in accordance with the present invention shown in FIG. 3, a momentary reflection on capacitor C2C is in order. This capacitor forms a voltage divider with capacitor C3C, which capacitor C3C may be considered the error signal capacitor. Accordingly, the voltage across capacitor C3C changes nearly instantaneously with any change in voltage across capacitor C2C.

The capacitor C2C serves the dual purposes of (i) speeding up the output transistor Q6C by connection of capacitor C2C via resistance R13C to the drain of the output transistor Q6C, and (ii) bleeding charge off the error capacitor C3C. The positive switching of error signal transistor Q4C, and output MOS power transistor Q6C, accorded thereby improves the noise immunity of the entire circuit.

Continuing with the explanation of circuit function, as transistor Q6C starts to come out of conduction, the drain-source voltage across this transistor Q6C starts rising towards system voltage "(P)-(N)". At some point, the drain-source voltage across transistor Q6C will become large enough so that the voltage divider circuit comprised of resistors R11C, R10C, R13C will produce a sufficiently large voltage across the base-emitter resistor R11C of flip-flop transistor Q5C so as to initiate conduction of this transistor Q5C. The positive-feedback effect of voltage divider comprised of resistors R11C, R10C, R13C assures that, once conduction is initiated in Q5C, this transistor Q5C will be driven into saturation as fast as allowed by the discharge path formed by the RC circuit consisting of (i) the total gate-source capacitance represented by C4C and (ii) the discharge resistor R12C. When transistor Q5C reaches saturation, it stays in this mode until a negative-going RESET pulse is externally applied to the base-emitter junction of transistor Q5C (through the voltage divider comprised of resistors R10C and R11C).

Second, the flip-flop transistor Q5C can go into conduction.

A large current (caused for example by a short-circuit across the alternator field winding) flowing through transistor Q6C will produce a large enough voltage drop across the drain-source terminals of MOS power transistor Q6C so as to make that the voltage divider network comprised of resistors R11C, R10C, and R13C will apply a sufficient voltage across the base-emitter junction of transistor Q5C so as to initiate conduction in this transistor Q5C. Because of the positive-feedback effect of the resistor network comprised of resistors R11C, R10C and R13C, once conduction is initiated in transistor Q5C, this transistor Q5C will be driven into saturation and, as discussed above, will thereafter stay in saturation until a negative-going RESET pulse is externally applied to the base-emitter junction of transistor Q5C.

A remarkable result of the above-described construction, and coaction, is that an extremely efficient (and practically free) short-circuit protection scheme for the output power transistor Q6C is obtained by virtue of the flip-flop connection between transistors Q6C and Q5C!

It is also clear from the above discussion that the negative-going RESET pulse, externally generated in the "OSCILLATOR" stage, starts a timing cycle in the output power transistor as follows:

During an "ON", or RESET, cycle the RESET pulse starts the "ON", or conduction, cycle of power transistor Q6C.

During an "OFF" cycle either the error-amplifier transistor Q4C terminates the "ON" cycle by synchronously detecting that system voltage reached a preset value or flip-flop transistor Q5C terminates the "ON" cycle because of a fault current flowing through power transistor Q6C.

The "OSCILLATOR" stage generates the negative-going RESET pulse with a duration that must be longer than either (i) the "OFF" to "ON" transitions, or (ii) the "ON" to "OFF" transitions in the power transistor (to avoid instability). Moreover this pulse must be generated at a frequency that is high enough to eliminate the voltage-current fluctuations present in Frequency-on-Demand voltage regulator designs.

An exemplary preferred "OSCILLATOR" stage shown in FIG. 3 is based on a Programmable Unijunction Transistor (PUT) design. In this particular design, the PUT is substituted by a two-transistor equivalent (Q1C, Q2C) that provides a negative resistance characteristic indispensable for oscillator functioning. Transistor Q2C is connected backwards to transistor Q1C (with its emitter and collector interchanged) to lower gain and avoid PUT latching.

The PUT oscillator output (positive-going pulse) appears across resistor R2C. Resistor R3C and transistor Q3C invert this signal that now appears as a negative-going pulse across Collector-Emitter of Q3C (the RESET pulse).

If the values of resistors R4C and R5C are made equal, then the desired frequency is obtained by proper selection of resistor R1C and capacitor C1C. Resistors R2C and R3C and capacitor C1C together determine the proper pulse duration.

Power to the oscillator is supplied by the voltage drops across zener diode DZ1C and the base-emitter junction of error-amplifier transistor Q4C. Integrating capacitor C3C stabilizes these two voltage drops.

Thus an inexpensive, high impedance, and highly-reliable oscillator results from the above construction which oscillator, by virtue of its high impedance, permits parasitic connection to the integrating capacitor C3C without interfering with the stability and/or regulation of the "ERROR AMPLIFIER" stage.

As mentioned above, capacitor C2C (in conjunction with resistor R13C) accelerates the "ON" and "OFF" transitions in output power transistor Q6C. Capacitor C2C also implements a "voltage bleeder" function on integrating capacitor C3C, assuring that the RESET pulse "bleeds away" a small fraction of the voltage stored on capacitor C3C (by virtue of capacitive divider effect). This assures proper synchronization between the "ERROR AMPLIFIER" stage and the "OUTPUT" stage, since integrating capacitor C3C is reset at the start of each "ON" cycle to a smaller voltage by virtue of the RESET pulse.

3. A Preferred Second Embodiment of a Pulse-Width-Modulated Electronic Voltage Regulator in Accordance with the Present Invention A schematic diagram of a preferred second embodiment of a pulse-width-modulated electronic voltage regulator in accordance with the present invention is shown in FIG. 4. A functional description of this preferred second embodiment of the electronic voltage regulator is as follows:

The network comprised by transistors Q6D and Q7D plus resistors R12D, R13D, R14D, R15D and R16D plus total capacitance across Gate-Source of transistor Q7D (represented by C4D in FIG. 4) is functionally a bi-stable multivibrator, or flip-flop. The "ON" time of the flip-flop is initiated by a negative-going RESET pulse applied to the base-emitter junction of flip-flop transistor Q6D through a voltage divider comprised of resistors R13D and R14D. The RESET pulse will stop conduction in transistor Q6D and start conduction in output transistor Q7D. Once transistor Q7D is conducting, it will stay conducting until turned "OFF" by either of the two following events:

As a first event, the error amplifier transistor Q4D will synchronously conduct when the system voltage reaches a predetermined value, driving transistor Q5D into conduction. Conducting transistor Q5D will then apply a positive pulse to the base-emitter junction of flip-flop transistor Q6D through a voltage divider comprised of resistors R9D, R13D, R14D and R16D. This positive pulse will rapidly drive transistor Q6D into saturation. Transistor Q6D will so stay in saturation, consequently turning "OFF" output transistor Q7D, until a negative-going RESET pulse is externally applied to the base-emitter junction of transistor Q6D.

As a second event, the flip-flop transistor Q6D will go into conduction because of a large current (caused, for example, by a short-circuit across the alternator field winding) flowing through output transistor Q7D. This large current will cause a large enough voltage drop across the drain-source junction of transistor Q7D so that the voltage divider network comprised of resistors R14D, R13D and R16D will apply sufficient voltage across base-emitter resistor R14D so as to initiate conduction in transistor Q6D. Once transistor Q6D starts conducting, it will rapidly be driven into saturation and will remain in saturation (consequently turning transistor Q7D "OFF") until a negative-going RESET pulse is externally applied to the base-emitter junction of flip-flop transistor Q6D. In the same manner as explained for the first preferred embodiment in section 2 above, this flip-flop creates an efficient and inexpensive short-circuit protection function for the MOS output power transistor Q7D.

Also as explained for the first preferred embodiment, the "ON" and "OFF" transitions of output transistor Q7D are slowed down by the gate charging resistors R12D, R15D and the gate discharge resistor R15D which resistors respectively interacting with the total capacitance C4D across the gate-source terminals of output transistor Q7D.

Finally, capacitor C2D interacting with resistor R16D speeds up the "ON" and "OFF" transitions in transistor Q7D, and also performs a "voltage bleeder" effect on capacitor C3D, in a like manner that capacitor C2C functioned in the first embodiment circuit of FIG. 3, thereby to provide proper synchronization between the "ERROR AMPLIFIER" stage and the "OUTPUT" stage.

4. A Preferred Third Embodiment of a Pulse-Width-Modulated Electronic Voltage Regulator in Accordance with the Present Invention A schematic diagram of a preferred third embodiment of a pulse-width-modulated electronic voltage regulator in accordance with the present invention is shown in FIG. 5. A functional description of this preferred third embodiment of the electronic voltage regulator is as follows:

The "ERROR AMPLIFIER" and "OUTPUT" stages shown in FIG. 5 are identical to the stages shown in FIG. 3 for the first preferred embodiment. The "OSCILLATOR" stage of this third preferred embodiment is now implemented using an integrated-circuit design (a CMOS version of the popular "555" Timer). The "555" Timer is connected as an a stable multivibrator with the "ON" and "OFF" cycles controlled by the values of resistors R1E and R2E plus capacitor C1E. With a proper choice of values for resistors R1E and R2E, and capacitor C1E, the RESET pulse-width and frequency can be accurately determined. Diode D1E is necessary to block the active-high output pulse of the "555" a stable multivibrator, permitting only a negative-going RESET pulse to reach the base-emitter junction of flip-flop transistor Q2E (through the voltage divider comprised of resistors R7E and R8E).

The functioning and performance of this third embodiment circuit of the present invention is equivalent to the first embodiment circuit shown in FIG. 3.

In accordance with the preceding explanation, variations and adaptations of an electronic voltage regulator in accordance with the present invention will suggest themselves to a practitioner of the electronic arts. For example, the circuits can clearly be implemented with either field effect transistor, or bipolar transistor, technology. Likewise, circuits using bipolar circuits of both the N-P-N and P-N-P types are routine.

In accordance with the preceding explanation, and the three embodiments within which the present invention has been shown, the invention should be interpreted broadly, in accordance with the following claims only, and not solely in accordance with those embodiments within which the invention has been taught.

What is claimed is:

1. An electronic voltage regulator comprising:
    a flip-flop, sensitive to a "RESET" pulse to initiate an "ON" condition, serving as an "OUTPUT" stage;
    an oscillator producing and providing a "RESET" pulse having a pre-defined pulse width and pulse period to the "OUTPUT" stage flip-flop; and
    an "ERROR AMPLIFIER" stage for switching the "OUTPUT" stage flip-flop "OFF" when system voltage synchronously reaches a preset value, thus terminating the "ON" period of the "OUTPUT" stage flip-flop.

2. The electronic voltage regulator according to claim 1 wherein the OUTPUT stage flip-flop comprises:
    a Field Effect Transistor (FET) having gate and source terminals;
    wherein a parasitic capacitance of the gate-source terminals of the FET acting alone or in parallel with an external capacitance, serves to slow negative- and positive-going transitions of the OUTPUT stage flip-flop therein to introduce a minimum of electrical noise into an electrical system in which the electronic voltage regulator is used.

3. The electronic voltage regulator according to claim 1 wherein the oscillator comprises:
    a two-transistor equivalent to a Programmable Unijunction Transistor (PUT), being two transistors with one transistor connected backwards to the other with its emitter and its collector interchanged so as to lower gain and avoid PUT latching.

4. The electronic voltage regulator according to claim 1 wherein the ERROR AMPLIFIER comprises:
    an integrating capacitor accumulating a fraction of the system voltage; and
    another, second, capacitor series-connected with the integrating capacitor to act as a voltage divider,
    a signal from this second capacitor being fed forward to the OUTPUT stage flip-flop to accelerate "ON" and "OFF" transitions,
    this second capacitor also providing "voltage bleeder" function to the integrating capacitor making that a RESET pulse "bleeds away" a small fraction of the voltage stored on this integrating capacitor by virtue of capacitive divider effect,
    the integrating and the second capacitors taken together assuring proper synchronization between the ERROR AMPLIFIER stage and the OUTPUT stage flip-flop, by assuring that the integrating capacitor will be reset at the start of each "ON" cycle to a smaller voltage by virtue of the RESET pulse;
    wherein by both noise immunity and response time are improved.

5. In an electronic voltage regulator that produces a pulse-width-modulated signal across the field winding of an alternator, the voltage regulator being connected across a battery that develops a voltage between a positive terminal and a negative terminal, the voltage regulator having
    an error amplifier, having a signal input port and a signal output port, selectively conducting respective to variations in the voltage of the battery so as to produce a control signal, the error amplifier connected from its signal output port to
    an output transistor responsive to the control signal for selectively conducting so as to produce at its output port the pulse-width-modulated signal,
    an improvement comprising:
        an oscillator producing and providing a "RESET" pulse having a pre-defined pulse width and pulse period; and
        using the output transistor as one leg of a flip-flop which flip-flop is sensitive to
            (i) the "RESET" pulse from the oscillator to initiate an "ON" condition of the flip-flop where its output transistor conducts, and
            (ii) the error amplifier stage for synchronously switching when the system voltage reaches a preset value the flip-flop to an "OFF" condition where its output transistor does not conduct, wherein the "ON" and the "OFF" periods of the flip-flop alternate; and wherein the oscillator, the error amplifier stage and the flip flop a one leg of which is the output transistor, produce in combination the pulse-width-modulated signal.

6. The improvement to an electronic voltage regulator according to claim 5 wherein the oscillator comprises:

a two-transistor equivalent to a Programmable Unijunction Transistor (PUT), being two transistors with one transistor connected backwards to the other with its emitter and its collector interchanged so as to lower gain and avoid PUT latching.

7. An electronic voltage regulator for controlling flow of current in a field coil of an alternator producing a system voltage, the electronic voltage regulator comprising:

a flip-flop resettable to an "ON" condition causing current to flow in the field coil of the alternator;

an oscillator producing and providing a reset pulse having a pre-defined pulse width and pulse period for resetting the flipflop; and an error amplifier synchronously switching the flip-flop to an "OFF" condition when the system voltage reaches a preset value, thus terminating the "ON" period of the stage flip-flop.

8. The electronic voltage regulator according to claim 7 wherein the flip-flop comprises:

a Field Effect Transistor (FET) having gate and source terminals;

wherein a parasitic capacitance of the gate-source terminals of the FET acting alone or in parallel with an external capacitance, serves to slow negative- and positive-going transitions of the flip-flop therein to introduce a minimum of electrical noise into an system voltage produced by the alternator.

9. The electronic voltage regulator according to claim 7 wherein the oscillator comprises:

a two-transistor equivalent to a Programmable Unijunction Transistor (PUT), being two transistors with one transistor connected backwards to the other with its emitter and its collector interchanged so as to lower gain and avoid PUT latching.

10. A method of regulation of a system voltage produced by an alternator having a field coil comprising:

controlling field coil current to the alternator through a bi-stable multivibrator, also called a flip-flop;

resetting the flip flop to provide the field coil current by and with a reset pulse of pre-defined pulse width and pulse period which reset pulse is produced by an oscillator; and terminate the ON period of the stage flip flop with and by a signal synchronously produced in an error amplifier when voltage produced by the alternator reaches a preset value;

wherein a constant-frequency, pulse-width-modulated, output signal is realized.

* * * * *